(12) United States Patent
Blackwell

(10) Patent No.: US 7,145,765 B2
(45) Date of Patent: Dec. 5, 2006

(54) SUPPORT DEVICE AND EXTENDER ASSEMBLIES FOR INTERPOSERS

(75) Inventor: Donald A. Blackwell, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 92 days.

(21) Appl. No.: 11/065,789

(22) Filed: Feb. 25, 2005

(65) Prior Publication Data

US 2005/0190534 A1 Sep. 1, 2005

Related U.S. Application Data

(60) Provisional application No. 60/548,437, filed on Feb. 27, 2004.

(51) Int. Cl.
*G06F 1/16* (2006.01)

(52) U.S. Cl. ............... 361/679; 361/600; 361/683; 361/759; 73/865.9; 324/158.1

(58) Field of Classification Search ............ 361/609, 361/679, 682, 683, 752, 754, 759, 748, 755; 324/158.1, 754, 537, 755, 538, 760, 764, 324/72.5; 73/865.9; 439/928.1, 959, 76.1, 439/327, 66, 68, 77, 225, 492

See application file for complete search history.

(56) References Cited

U.S. PATENT DOCUMENTS

| | | | | |
|---|---|---|---|---|
| 6,115,259 A | * | 9/2000 | Karner | 361/759 |
| 6,124,707 A | * | 9/2000 | Kim et al. | 324/158.1 |
| 6,806,700 B1 | * | 10/2004 | Wanek et al. | 324/158.1 |
| 6,819,126 B1 | * | 11/2004 | Los et al. | 324/754 |
| 2005/0109131 A1 | * | 5/2005 | Wanek et al. | 73/865.9 |

* cited by examiner

*Primary Examiner*—Michael Datskovskiy
(74) *Attorney, Agent, or Firm*—Workman Nydegger

(57) ABSTRACT

Methods and apparatuses for mounting an interposer in a chassis. An apparatus can include a spreader frame attached to an interposer, and supporting means attached to the spreader frame for supporting the spreader frame within a chassis. The supporting means can include a first extendable arm and a second extendable arm supported by the spreader frame and biased in opposing directions such that opposing ends engage surfaces of opposing sidewalls of the chassis when the adjustable support structure is installed in the chassis. A method for mounting an interposer within the chassis can include adjusting a distance between opposing ends of the first extendable arm and the second extendable arm to engage inner surfaces of the chassis and hold the interposer and support structure in a static position within the chassis.

20 Claims, 5 Drawing Sheets

SUPPORT DEVICE AND EXTENDER ASSEMBLIES FOR INTERPOSERS

CROSS-REFERENCE TO RELATED APPLICATIONS

This application claims the benefit of U.S. Provisional Application No. 60/548,437 entitled "SUPPORT DEVICE AND EXTENDER ASSEMBLIES FOR INTERPOSERS" filed Feb. 27, 2004, the contents and disclosure of which are hereby incorporated by reference.

BACKGROUND OF THE INVENTION

1. The Field of the Invention

The present invention relates to tapping data associated with internally mounted electronic devices. More specifically, the present invention relates to methods and apparatuses for mounting interposers within a chassis housing electronic devices.

2. Background and Relevant Art

Monitoring, analyzing, and testing of data flow requires tapping into data streams to capture or sample the data. Tapping into internally mounted devices such as hard disk drive (HDD) arrays or printed circuit board assembly (PCBA) arrays presents significant challenges. These devices are typically mounted in a chassis frame or card cage with direct signal connections between the device (e.g. HDD or PCBA arrays) and a motherboard or backplane containing one or more sockets that can receive one or more additional circuit boards. The devices (e.g. HDD or PCBA arrays) are typically supported using some convenient installation or removal method such as card guides or mounting rails. Often, access to the interior of the chassis or cage, and particularly the signal connectors, is restricted or non-existent. A lack of standardization in the industry further exacerbates these challenges.

Methods and associated apparatuses for tapping into data streams carried by these systems typically involve the use of a tapping device commonly called an interposer. An interposer typically consists of a PCBA with input and output connectors that match the connectors of the tapping device and the backplane or motherboard within the chassis or cage. Although data is typically communicated bi-directionally through the interposer, the interposer connector that couples with the tapping device connector is defined herein as the "input connector" and the interposer connector that couples with the backplane connector of the chassis or cage is defined herein as the "output connector."

During installation, the interposer can be first plugged into the tapped device and the tapped device can then be installed in the chassis or cage. A problem arises, however, in completing the second connection. Typically, the device connector, or the backplane connector, does not have the ability to support the interposer to maintain a required connector alignment. Further, because there is no access to the interior of the chassis or cage, manual alignment is not possible. Thus, what would be advantageous are apparatuses and associated methods for enabling interposers to be conveniently used with internally mounted devices such as hard disk drive arrays or PCBA arrays.

SUMMARY OF THE INVENTION

The present invention relates to methods and apparatuses for mounting interposers within a chassis housing electronic devices. According to an embodiment of the present invention, an apparatus for supporting an interposer within a chassis is described. The apparatus can comprise a mounting assembly for mounting the apparatus to the interposer, and a spreader assembly supported by the mounting assembly. The spreader assembly can comprise a first extendable arm supported by a spreader frame, and a second extendable arm supported by the spreader frame. Opposing ends of the first extendable arm and the second extendable arm can be selectively engageable with opposing interior sidewalls of the chassis when the spreader assembly selectively mounts to the chassis.

According to an embodiment of the present invention, an interposer is disclosed. The interposer can include an output connector coupled to a printed circuit board for coupling the interposer with a connector of a chassis, an input connector coupled to the printed circuit board for coupling the interposer with an electronic tapping device, and supporting means selectively mountable to the printed circuit board for supporting the interposer within the chassis.

According to an embodiment of the present invention a method for mounting an interposer within a chassis using a support structure is disclosed. The support structure can include a spreader frame coupled to the interposer, a first extendable arm supported by the spreader frame, and a second extendable arm supported by the spreader frame. The method can include adjusting a distance between opposing ends of the first extendable arm and the second extendable arm to fit within opposed sidewalls of the chassis, placing the interposer and support structure within the chassis, and extending the distance between opposing ends of the extendable arms such that the opposing ends of the extendable arms engage inner surfaces of the chassis and hold the interposer and support structure in a static position within the chassis.

These and other objects and features of the present invention will become more fully apparent from the following description and appended claims, or may be learned by the practice of the invention as set forth hereinafter.

DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention.

The present invention is directed to a spreader mechanism or device for interposers that supports the interposer and enables interposers to be used with internally mounted devices such as hard disk drive arrays or PCBA arrays mounted within a chassis frame or card cage. The principles of the invention disclosed herein can also be applied to generic extender PCBAs or other similar devices that have to be installed in a variety of different chassis or cage configurations. An embodiment of the invention can include a spreader device that attaches to an interposer and can include arms that extend outwardly to engage with opposing inside surfaces of the chassis frame or card cage enclosing various arrays or other electronic devices intended for tapping.

Figure 1:
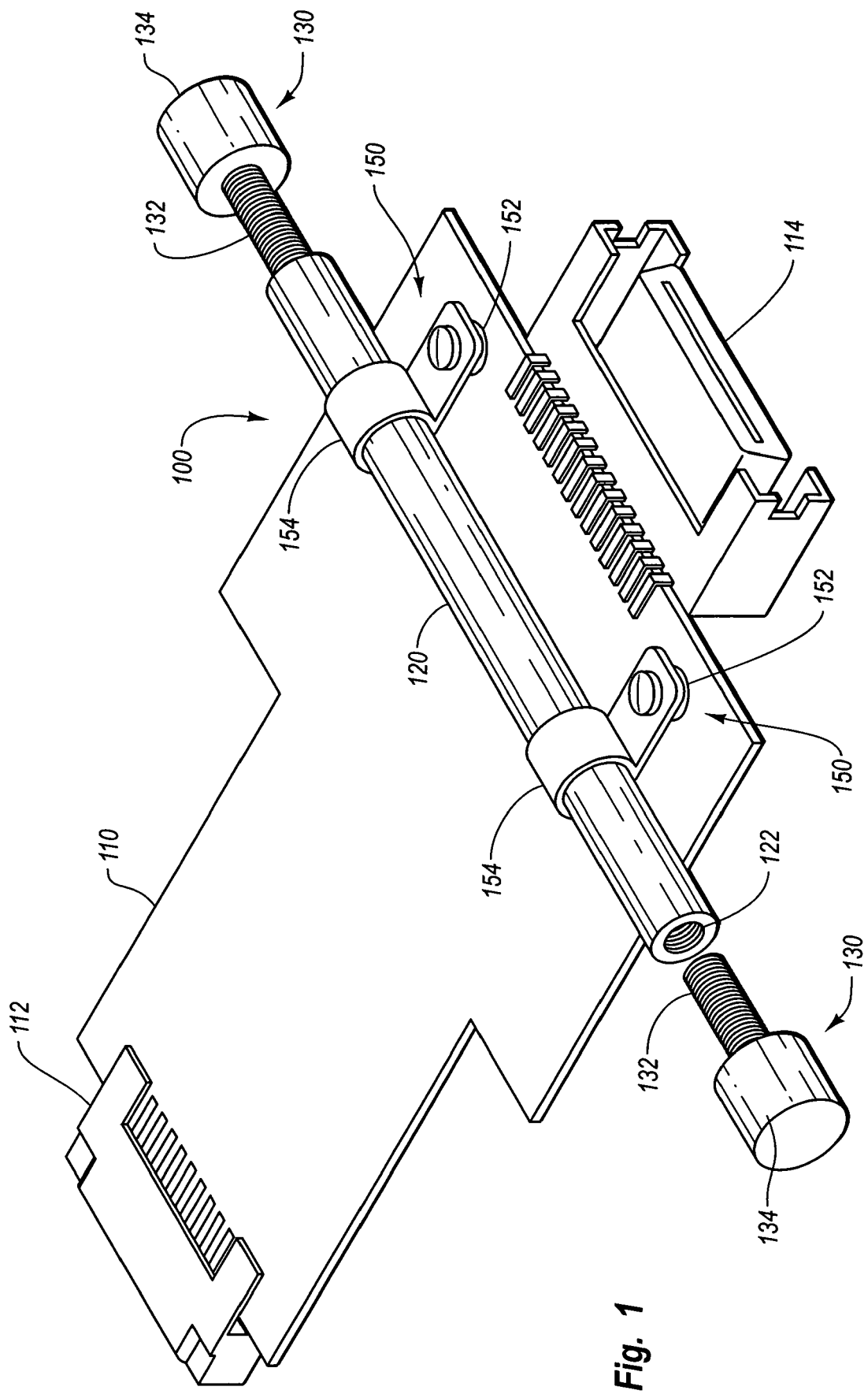
FIG. 1 illustrates a threaded adjustable spreader according to an example embodiment of the present invention.

Turning to FIG. 1, illustrated is one exemplary configuration of a spreader device, identified by reference numeral 100. This spreader assembly 100 can attach to an interposer 110 to enable installation of the interposer 110 in a chassis or card cage. By so doing, the spreader assembly 100 can allow (i) an output connector 112 of the interposer 110 to engage with a backplane connector (not shown), and (ii) an input connector 114 to be accessible for connection of an electronic tapping device, such as network protocol analysis tapping and analysis devices.

The spreader assembly 100 can include a spreader member or frame 120 that engages with two extendable arms 130 located at opposing ends of the spreader frame 120 as shown in FIG. 1. The spreader frame 120 can be embodied by a tubular or generally solid member to which the extendable arms 130 threadably or slidably connect. For instance, each end of spreader frame 120 can include an internally threaded recess 122 to receive a complementary externally threaded portion 132 of the extendable arms 130. Varying the degree of engagement of the threaded recesses 122 with the threaded portion 132 changes the distance which extendable arms 130 extend from the end of the spreader frame 120. It will be understood that each extendable arm 130 can be moved independently of the other extendable arm 130. Therefore, each extendable arm 130 can extend the same or different distance from the spreader frame 120.

Collectively, the threaded recess 122 and the threaded portion 132 form a threaded joint that allows the extendable arms 130 to extend outwardly toward internal surfaces of opposing walls of a chassis and apply opposed biasing forces or pressures to the inside surfaces of the walls of the chassis such that a static friction force between the extendable arms 130 and the inside surfaces of the walls hold the interposer 110 in place within the chassis. While the threaded joint has been depicted as including helical threads, the threaded joint can include straight threads, splines, pivots, or other appropriate joints for extending the extendable arms outward. The threaded joint can also include a locking mechanism for locking the threaded joint in an extended position.

To further aid in creating the desired frictional or biased contact with the interior surfaces of the chassis, each extendable arm 130 can include a bumper 134. Each bumper 134 can be made of any appropriate material (e.g. rubber) for producing a frictional engagement against inside surfaces of a chassis such that the interposer 110 is retained in a position within the chassis. The bumpers 134 can be directly fixed to the threaded portions 132, such as when the extendable arms 130 have the form of a rubber member with integral metal or plastic threaded studs. Alternatively, the bumpers 134 can couple to the threaded portion 132 by fixing to an intermediate portion(s) (not shown) that attaches to the threaded portions 132. The fixing of the bumpers 134 to the threaded portions 132, or the intermediate portion(s), can be achieved using glue, adhesive, frictional engagement, mechanical fasteners, or other appropriate means for attaching two members of similar or dissimilar materials.

The spreader assembly 100 can couple to the interposer 110 for supporting the interposer 110 within the inside of the chassis. For example, the spreader assembly 100 can be attached in place on the interposer 110 with mounting assemblies 150. The mounting assemblies 150 can include standoffs 152 and clamps 154 as shown in FIG. 1. The standoffs 152 can position the spreader frame 120 above a surface of the interposer 110 sufficiently to allow for twisting of each extendable arm 130 relative to the spreader frame 120. Each clamp 154 mounts to one of the standoffs 152 by way of a mechanical fastener, adhesive, etc. Upon mounting, the clamps 154 surround a portion of the spreader frame 120, apply a constraining force upon the spreader frame 120, and prevent movement of the spreader frame 120 relative to the interposer 110.

Although the above described mounting assemblies 150 are one exemplary manner for attaching the spreader assembly 100 to the interposer 110, one skilled in the art will understand that there are various other manners for performing such function. For example, integral tabs, brackets, bolts, screws, rivets, adhesives, glues, mechanical fasteners, chemical fasteners, as well as other means for attaching the spreader to the interposer are possible.

Figure 2:
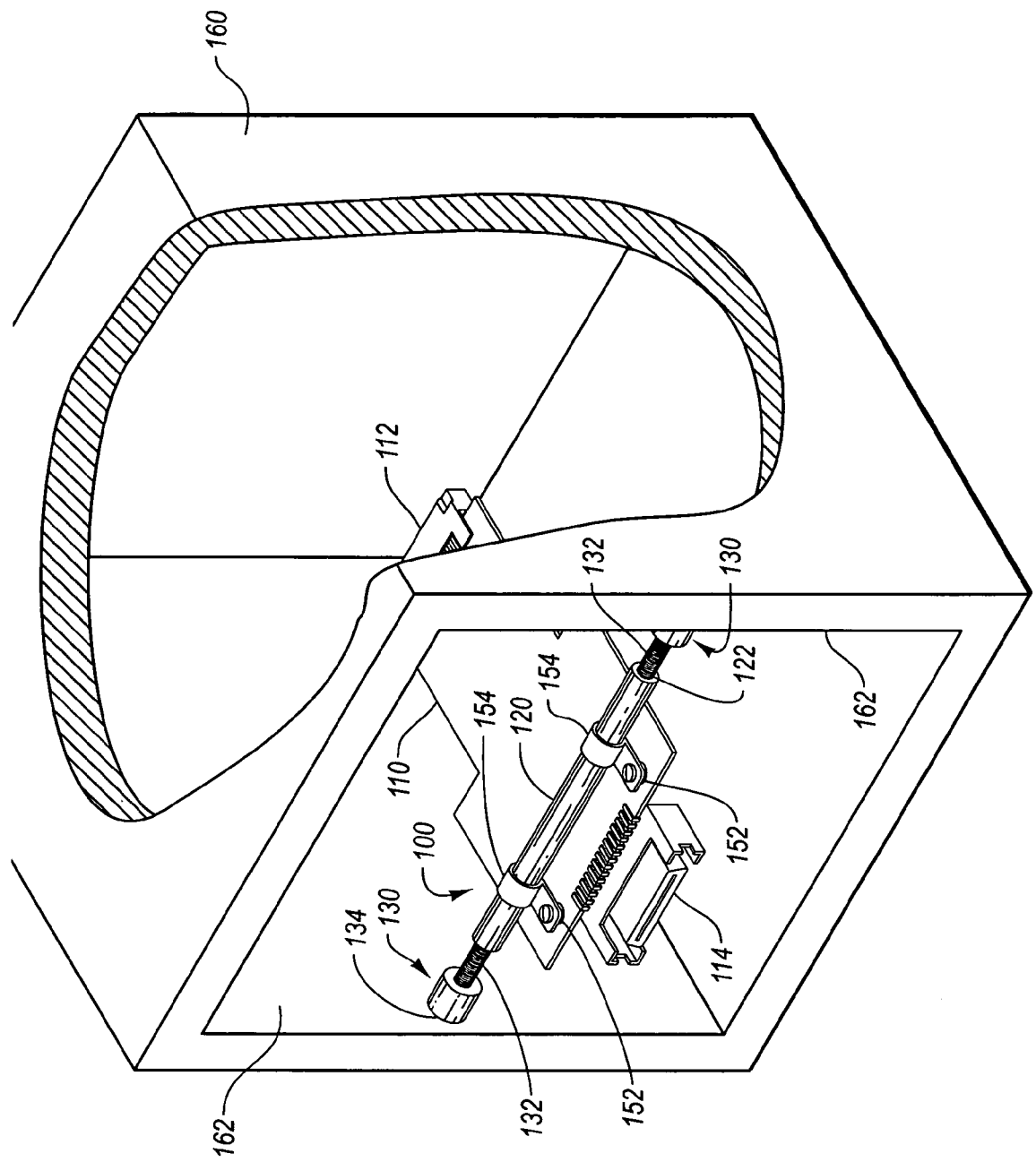
FIG. 2 illustrates an interposer mounted to a threaded adjustable spreader assembly held within a chassis according to an example embodiment of the present invention.

Referring now to FIG. 2, a spreader assembly 100 is illustrated mounted within a chassis 160 supporting a corresponding interposer 110. As shown, the chassis 160 includes interior surfaces 162 to which the spreader assembly 100 can engage. More specifically, the bumpers 134 of the spreader assembly 100 can frictionally engage with opposing inside surfaces 162 of the chassis 160 and locate the interposer 110 in the desired position within the chassis 160. In practice, extendable arms 130 and bumpers 134 can be retracted by manipulating the threaded joints such that the distance between bumpers 134 is reduced. The interposer 110 is placed within the chassis 160 and aligned to permit the output connector 112 of the interposer 110 to couple with a backplane connector (not shown) of the chassis 160. By manipulating the threaded joints, the threaded portions 132 are unthreaded from the threaded recesses 122 until a sufficient force is applied to opposing inside surfaces 162 of the chassis 160 to hold the interposer 110 in place. Once the interposer 110 is secured inside the chassis 160, an electronic tapping device can be connected to the interposer 110 such that it couples with the input connector 114 of the interposer 110.

The spreader assembly 100 can be different sizes and configurations to accommodate different chassis structures and environments. However, because the spreader assembly 100 includes the extendable arms 130, the spreader assembly 100 can be used in a variety of mechanical environments and in many instances may not need to be customized for each chassis configuration with which it is to be used. In some instances where there is limited space to work within the chassis 160 it may be somewhat cumbersome to hold the interposer 110 in correct alignment while the bumpers 134 are extended.

As a result, various other less cumbersome methods and apparatuses can be implemented for producing a force against an inside surface of a chassis to install an interposer within a chassis according to example embodiments of the present invention. One exemplary configuration of such less cumbersome apparatus is illustrated in FIGS. 3A and 3B.

Figure 3:
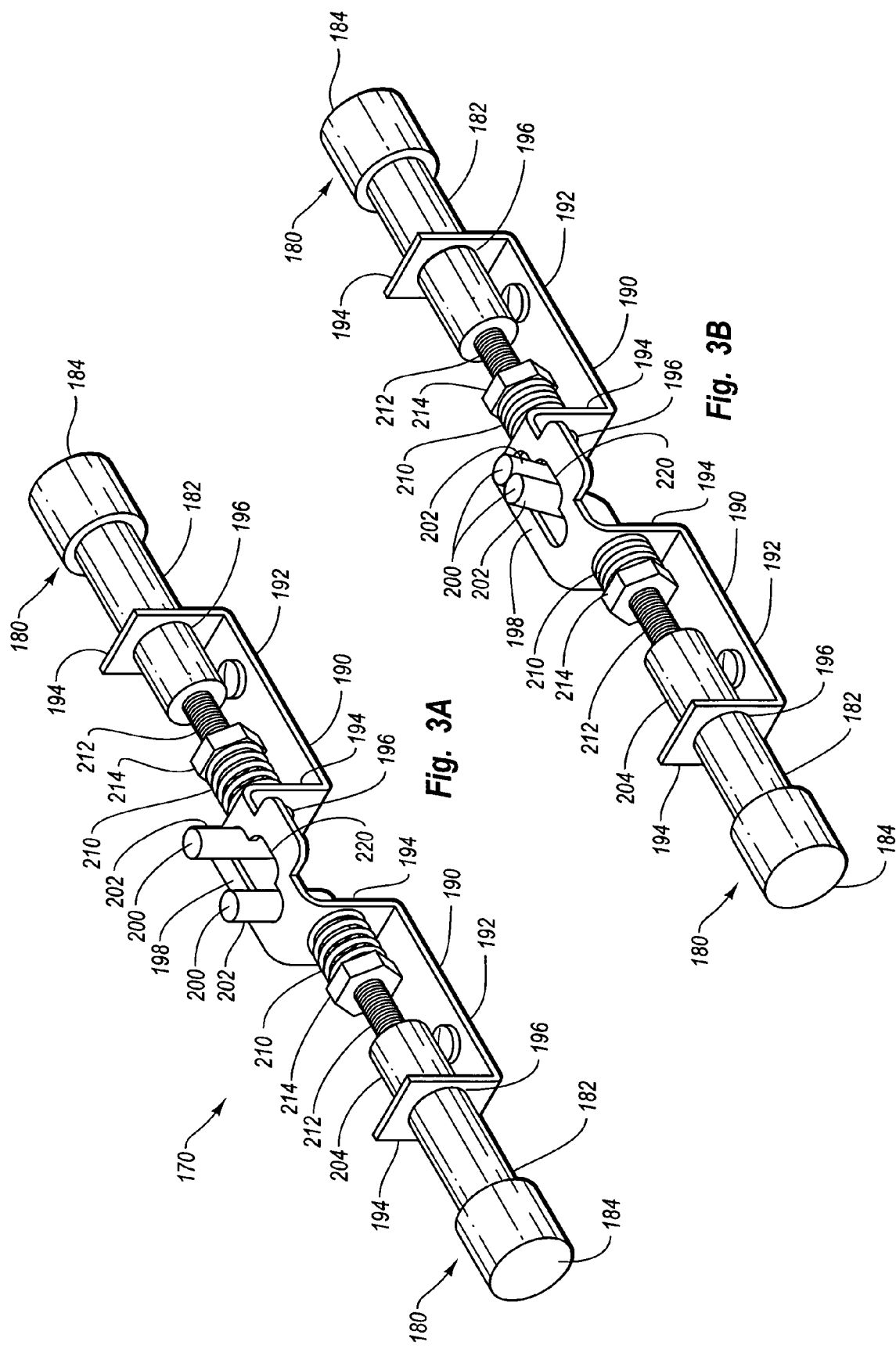
FIG. 3A illustrates an adjustable support structure with spring-biased opposing extendable arms according to an example embodiment of the present invention.
FIG. 3B illustrates an adjustable support structure in a retracted position for deployment in a chassis according to an example embodiment of the present invention.

Turning firstly to FIG. 3A, depicted is an illustration of a spreader assembly 170 according to sn exemplary configuration. As illustrated, the spreader assembly 170 has two extendable arms 180, each of which is supported by a spreader frame 190. In addition to supporting the extendable arms 180, the spreader frame 190 also supports two levers 200 that also slidably engage with the spreader frame 190 to move the two extendable arms 180 in opposed directions.

Each extendable arm 180 can include an internally threaded portion 182 and a bumper 184. Each internally threaded portion 182 can threadably engage and cooperate with an externally threaded portion 212 of a corresponding lever 200 to change the distance at which each extendable arm 180 is held. In this particular configuration, each threaded portion 182 of the extendable arms 180 receives a threaded portion 212 of the levers 200. It will be understood that each extendable arm 180 can be moved independently of the other extendable arm 180. Therefore, each extendable arm 180 can extend independently outwardly from the spreader frame 190.

Collectively, the threaded portions 212 of the levers 200 and the threaded portions 182 of the extendable arms 180 form threaded joints that allow the extendable arms 180 to extend outwardly thereby changing the distance at which each extendable arm 180 is held allowing for applications of the spreader 170 in additional chassis configurations. While the threaded joints have been depicted as including helical threads, the threaded joints can include straight threads, splines, pivots, or other types of joints for adjusting the distance at which the extendable arms 180 are held. The threaded joints can also include a locking mechanism for locking the threaded joint in a position.

Bumpers 184 can be made of any appropriate material to aid with mounting the spreader assembly 170 within a chassis. The bumpers 184 can be directly fixed to the threaded portions 182. Alternatively, the bumpers 184 can couple to the threaded portions 18 by fixing to an intermediate portion(s) that attach to the threaded portions 182. The fixing of the bumpers 184 to the threaded portions 182, (or any intermediate portion(s)), can be achieved using glue, adhesives, frictional engagement, mechanical fasteners or other appropriate means for attaching two members of similar or dissimilar materials.

As mentioned, extendable arms 180 slidably engage with the spreader frame 190. The spreader frame 190 can include base members 192 with a plurality of support members 194 extending form the base members 192. Base members 192 aid with attaching spreader assembly 170 to an interposer, such as the interposer illustrated in FIG. 4, and as will be discussed in more detail hereinafter.

The support members 194 of the spreader frame 190 support and aid in positioning the extendable arms 180 and the levers 200 so that motion of the levers 200 cause corresponding movement of the extendable arms 180. To achieve this, each support member 194 can include a hole 196 of an appropriate diameter that receives a portion of the extendable arms 180 and/or the levers 200. Optionally, each hole 196 can include a bushing or other friction reducing mechanism or device to reduce the frictional engagement between the arms 180 and/or the levers 200 and the support members.

Although mention is made herein of the spreader frame 190 including one or more base members 192 and one or more support members 194, it can be understood that the spreader frame 190 can include integral base members 192 and/or support members 194 as depicted, or can include separate base members 192 and/or support members 194 that are connected together, such as by welding, adhesives, mechanical fasteners, or other techniques, to create the spreader frame 190. The spreader frame 190 can be of any suitable configuration to provide structural support and cooperation of the other spreader assembly 170 components.

With continued reference to FIG. 3A, each lever 200 has a generally "L" shaped configuration including a locking portion 202. The locking portion 202 cooperates with an intermediate member 198 of the spreader frame 190 to help position the extendable arms 180 attached to the levers 200 in a desired position. The levers 200 can extend through one or more of the holes 196 of the spreader frame 190 to engage with the threaded portion 182 of the extendable arms 180 as are shown in FIGS. 3A and 3B. The threaded portions 212 include threads complementary to that of the threaded portion 182 of the extendable arms 180 to which it connects. The interaction between the complementary threaded portions of the extendable arms 180 and the levers 200 can be considered an adjustment mechanism. This is only one example of structure capable of performing the function of means for adjusting the relative position of the arm to the lever. One skilled in the art can understand and identify various other appropriate means. For instance, the extendable arms 180 and the levers 200 can slidably cooperate using threads, pivots or shafts to adjust the dimensions of the spreader assembly 170 and can incorporate a locking mechanism to lock the extendable arms 180 at a chosen length.

Mounted to each lever 200 can be a biasing spring 210 and a retaining nut 214. The biasing springs 210 can be disposed around a portion of the levers 200 as shown. One end of the biasing spring 210 can engage with one of the support members 194 of the spreader frame 190, while the other end can engage with the retaining nut 214 mounted to the threaded portions 212 of the levers 200. It will be understood that other structures or mechanical fasteners can perform a similar function to the retaining nut 214. For instance, pins, clips, or structures extending from the lever 200 can limit movement of an end of the biasing spring 210.

By fixing the location of the biasing spring 210 using the support member 194 and the retaining nut 214, the biasing spring 210 applies a biasing force against movement of the levers 200 relative to the spreader frame 190. Stated another way, as the locking portions 202 of the two levers 210 can be moved outward together, the biasing springs 210 mounted on the two levers 200 apply a biasing force against inward motion and thereby limiting inward movement of the levers 200 without application of an inward force by a user. By varying the position of the nut 214 along the threaded portion 212, the amount of biasing force can be varied by varying the amount of compression applied by the biasing springs 210 as the levers 200 move relative to the spreader frame 190.

To allow for the levers 200 to move, the spreader frame 190 can include the intermediate member 198 extending between two of the support members 194. The intermediate member 198 can cooperate with the levers 200 to selectively maintain the extendable arms 180 in a desired relative position and can be used to lock the relative position of the levers 200 at a retracted position. As such, the intermediate member 198 can function as part of a releasable locking mechanism for locking the spreader assembly 170 in a retracted position.

As shown, the intermediate member 198 can include a releasable locking recess 220 into which the locking portions 202 of the levers 200 can extend when placed in a locked position, as is illustrated in FIG. 3B. The locking recess 220 can receive the locking portions 202 when the spreader assembly 170 is mounted within the chassis (not shown). To place the locking portions 202 into the locking recess 220, a user applies a force to the locking portions 202 and moves the two locking portions 202 towards the center of the locking recess 220 and then rotates the locking portions 202 into engagement with walls of the locking recess 220 as shown in FIG. 3B thereby placing the spreader assembly 170 in a retracted and locked position. Movement of the first portions 202 can occur together or individually.

The locking recess 220 retains the locking portions 202 until a force is applied to the locking portions 202 by the user to begin movement of the locking portions 202 out of the locked position shown in FIG. 3B and into the unlocked position shown in FIG. 3A. The biasing force applied by the biasing spring 210 can complete the movement of the locking portions 202 into the unlocked and extended position as shown in FIG. 3A as the biasing spring 210 expands to force the bumpers 184 into contact with the interior surface of the chassis.

Figure 4:
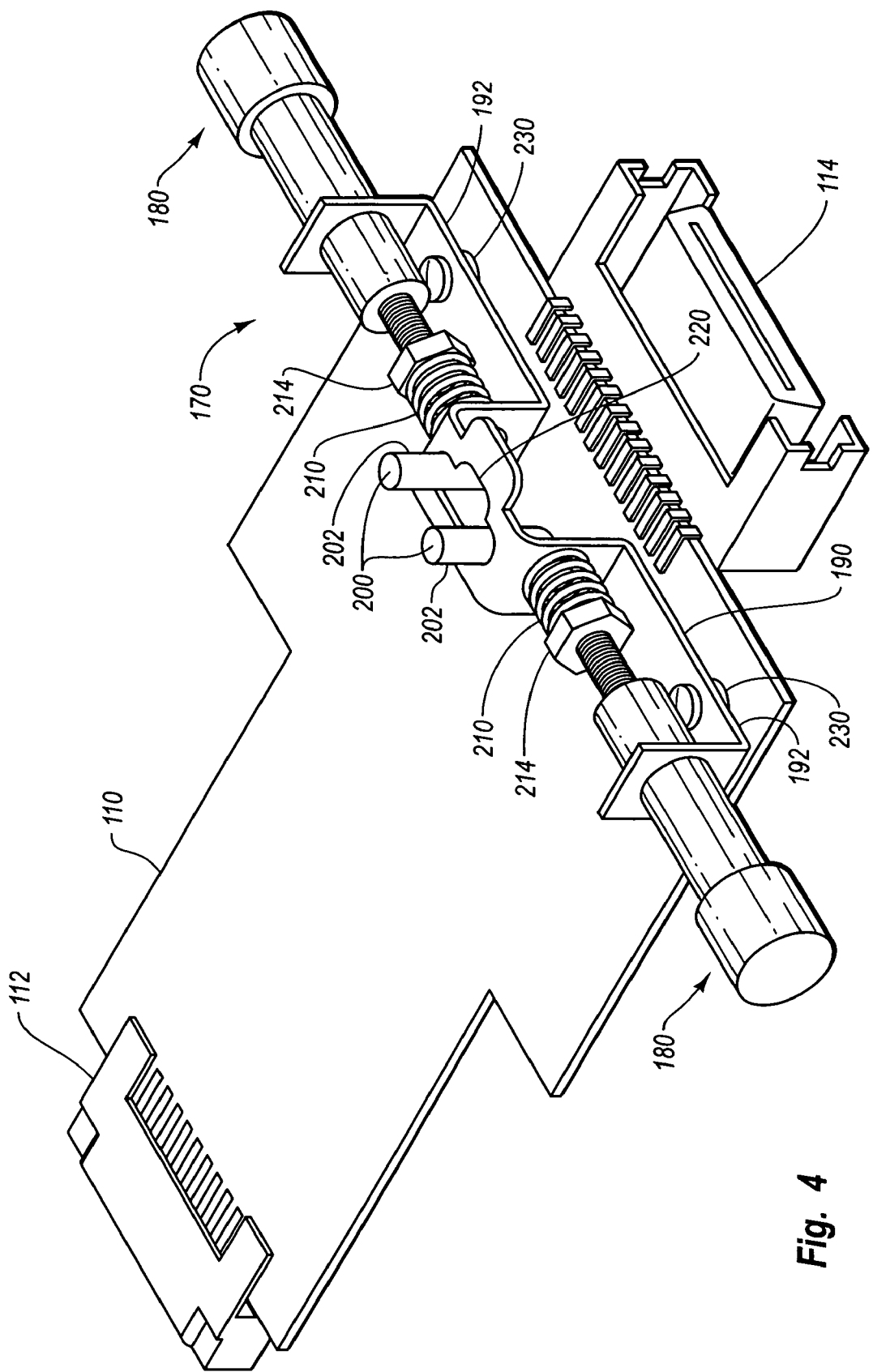
FIG. 4 illustrates an adjustable support structure mounted to an interposer according to an example embodiment of the present invention.

Referring now to FIG. 4, a spreader assembly 170 is shown mounted to an interposer 110 with one or more brackets 230 that extend from the interposer 110 to the base members 192. These one or more brackets 230 can function as a mounting assembly that attaches the interposer 110 to the spreader assembly 170. In the illustrated configuration, the brackets 230 have the form of standoffs that attach to the base members 192 and the interposer 110 by way of adhesives, glues, mechanical fasteners, and other manners for attaching one component to another component.

Figure 5:
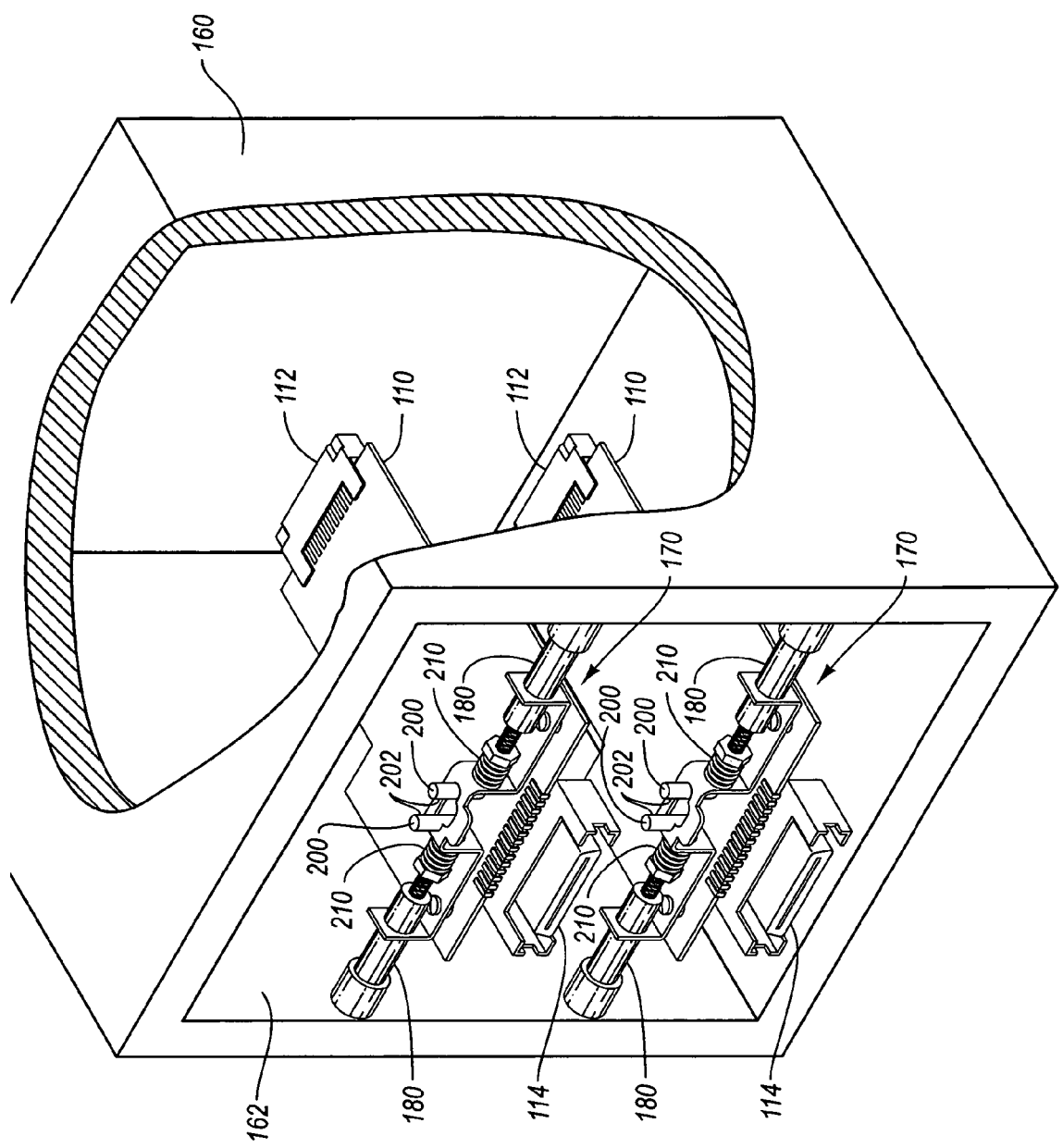
FIG. 5 illustrates a chassis with multiple interposers mounted to associated adjustable support structures mounted with the chassis according to an example embodiment of the present invention.

With reference to FIG. 5, multiple interposers 110 can be mounted within a chassis 160, such as a disk drive array chassis. The chassis 160 can be any structure in which at least one electronic device is mounted. For example, an electronic device can be a host device or rack, a card cage, or any other chassis that receives at least one internally-mounted electronic device. When the interposers 110 are in the position shown in FIG. 5, the disk drives can be installed into the chassis 160 by connecting the device connectors of the disk drives with the corresponding output connectors 112 of the interposers 110. The interposers 110 can then be used to tap data transmitted or received by the disk drives by connecting tapping devices to the input connectors 114. The data that is accessed by the interposers 110 can be monitored, analyzed, stored, or otherwise processed as desired.

To mount the interposers 110 within the chassis 160, the extendable arms 180 are retracted against the forces applied by biasing springs 210 from their initial position (e.g. as shown in FIG. 3A) to a locked position (e.g. as shown in FIG. 3B). To achieve this, the extendable arms 180 are held in place by slipping locking portions 202 of adjacent ends of extendable arms 180 into the locking recess 220. Once locked, the interposer 110 can then be placed within the chassis 160 and aligned so that the output connectors 112 of the interposers 110 couple with a backplane connector of the chassis 160. Once aligned, the locking portions 202 of the levers 200 can be disengaged from the locking recess 220, thereby fixing the interposer 110 in place within the chassis 160. The length of the extendable arms 180 can be adjusted by rotating the extendable arms 180 relative to the levers 200 as discussed above.

In general, the principles of the invention disclosed herein can be used in connection with substantially any PCB, particularly those that are to be used in confined spaces or with internally mounted devices. While specific embodiments are illustrated in the accompanying drawings, embodiments of the invention can be implemented to support substantially any interposer.

The present invention may be embodied in other specific forms without departing from its spirit or essential characteristics. The described embodiments are to be considered in all respects only as illustrative and not restrictive.

The invention claimed is:

1. An apparatus for selectively supporting an interposer within a chassis, the apparatus comprising:
   a mounting assembly for mounting the apparatus to the interposer; and
   a spreader assembly supported by the mounting assembly, the spreader assembly comprising:
   a first extendable arm supported by a spreader frame;
   a second extendable arm supported by the spreader frame; and
   wherein opposing ends of the first extendable arm and the second extendable arm are selectively engageable with opposing interior sidewalls of the chassis when the spreader assembly selectively supports the interposer within the chassis.

2. The apparatus of claim 1, wherein the first extendable arm is biased in a first outward direction away from the spreader frame and the second extendable arm is biased in a second outward direction away from the spreader frame in a direction opposite to the first outward bias direction.

3. The apparatus of claim 1, further comprising rubber bumpers coupled to the opposing ends of the first and second extendable arms.

4. The apparatus of claim 1, wherein at least one of the first extendable arm and the second extendable arm comprises an adjustment mechanism for adjusting arm length.

5. The apparatus of claim 4, further comprising means for maintaining a selectable bias force against the first extendable arm and the second extendable arm at different arm lengths.

6. The apparatus of claim 1, further comprising a releasable locking assembly for releasably retaining at least one of the first extendable arm and the second extendable arm in a retracted position.

7. The apparatus of claim 6, wherein the releasable locking assembly includes a locking recess for locking adjacent lever portions of the extendable arms in a retracted position.

8. The apparatus of claim 1, wherein each of the first extendable arm and the second extendable arm threadably engages with the spreader frame to enable each of the first extendable arm and the second extendable arm to extend outward and engage interior surfaces of the chassis.

9. An interposer comprising:
   an output connector coupled to a printed circuit board for coupling the interposer with a connector of a chassis;

an input connector coupled to the printed circuit board for coupling the interposer with an electronic tapping device; and supporting means selectively mountable to the printed circuit board for supporting the interposer within the chassis.

10. The interposer of claim 9, wherein the supporting means comprises:

a spreader frame selectively mounted to the interposer;

a first extendable arm supported by the spreader frame and extendable in a first outward direction; and a second extendable arm supported by the spreader frame and extendable in a second outward direction, wherein opposing ends of the first extendable arm and the second extendable arm are selectively engageable with surfaces of opposing sidewalls of the chassis for supporting the interposer when the supporting means is installed in the chassis.

11. The apparatus of claim 10, wherein at least one of the first extendable arm and the second extendable arm has an adjustable length.

12. The apparatus of claim 10, further comprising:

a first biasing means for biasing the first extendable arm in a first outward direction;

a second biasing means for biasing the second extendable arm in a second outward direction, wherein the second outward direction is in a direction that is opposite to the first outward direction; and a releasable locking mechanism for releasably locking at least one of the first extendable arm and the second extendable arm in a retracted position against the outward biasing forces of the first and second biasing means.

13. The apparatus of claim 12, wherein the locking mechanism includes a locking recess that is configured to releasably lock adjacent lever portions of each extendable arm in a retracted position.

14. A method for mounting an interposer within a chassis using a support structure, the support structure comprising a spreader frame coupled to the interposer, a first extendable arm supported by the spreader frame, and a second extendable arm supported by the spreader frame, the method comprising:

adjusting a distance between opposing ends of the first extendable arm and the second extendable arm to fit within opposed sidewalls of the chassis;

placing the interposer and support structure within the chassis; and extending the distance between opposing ends of the extendable arms such that the opposing ends of the extendable arms engage inner surfaces of the chassis and hold the interposer and support structure in a static position within the chassis.

15. The method of claim 14, further comprising releasably locking the first extendable arm and the second extendable arm in a retracted position with respect to the spreader frame.

16. The method of claim 15, wherein the first extendable arm is releasably locked in a retracted position by sliding a first locking portion of a first lever connected the first extendable arm into a locking recess in the spreader frame.

17. The method of claim 16, wherein the second extendable arm is releasably locked in a retracted position by sliding a second locking portion of a second lever connected the second extendable arm into the locking recess in the spreader frame.

18. The method of claim 14, further comprising releasing the first extendable arm and the second extendable arm such that the opposing ends of the first extendable arm and the second extendable arm establish frictional engagements with inner surfaces of opposing sidewalls of the chassis.

19. The method of claim 14, further comprising:

connecting an output connector coupled to the interposer to a backplane connector of the chassis; and connecting a tapping device connector to an input connector of the interposer.

20. A method for mounting a plurality of interposers within the same chassis comprising mounting a plurality of interposers within a chassis according to the method of claim 14.

* * * * *